United States Patent [19]
Ettenberg

[11] 3,890,194
[45] June 17, 1975

[54] METHOD FOR DEPOSITING ON A SUBSTRATE A PLURALITY OF EPITAXIAL LAYERS IN SUCCESSION

[75] Inventor: Michael Ettenberg, Freehold, N.J.

[73] Assignee: RCA Corporation, New York, N.Y.

[22] Filed: Apr. 11, 1974

[21] Appl. No.: 459,951

[52] U.S. Cl. ................ 156/622; 118/415; 148/172; 427/86; 427/419; 427/431
[51] Int. Cl.[2] .......................................... H01L 29/14
[58] Field of Search ...... 117/201, 69, 114 R, 114 C, 117/102 R, 102 M; 148/171, 172; 118/415

[56] References Cited

UNITED STATES PATENTS

| | | | |
|---|---|---|---|
| 3,565,702 | 2/1971 | Nelson | 117/201 X |
| 3,692,594 | 9/1972 | Cannuli | 117/201 X |
| 3,741,825 | 6/1973 | Lockwood et al. | 117/201 X |
| 3,755,011 | 8/1973 | Kleinknecht et al. | 148/171 |

*Primary Examiner*—Ralph Husack
*Attorney, Agent, or Firm*—Glenn H. Bruestle; Donald S. Cohen

[57] ABSTRACT

A deposition furnace boat includes a plurality of wells each of which is adapted to contain a solution of the material to be deposited. A slide extends across the bottoms of the wells and is adapted to carry a substrate from one well to the next. Between each pair of adjacent wells is a narrow slot extending to the surface of the slide. Epitaxial layers are deposited on the substrate by moving the slide to bring the substrate into each well in succession. While the substrate is in each well, the solution is cooled to deposit the material from the solution onto the substrate. When the slide is moved to carry the substrate from one well to the next, the substrate passes beneath the slot which is between the wells. Any of the solution which may be carried with the substrate from the one well will be drawn up into the slot by capillary action so as to prevent contamination of the solution in the next well by any carry-over solution.

2 Claims, 1 Drawing Figure

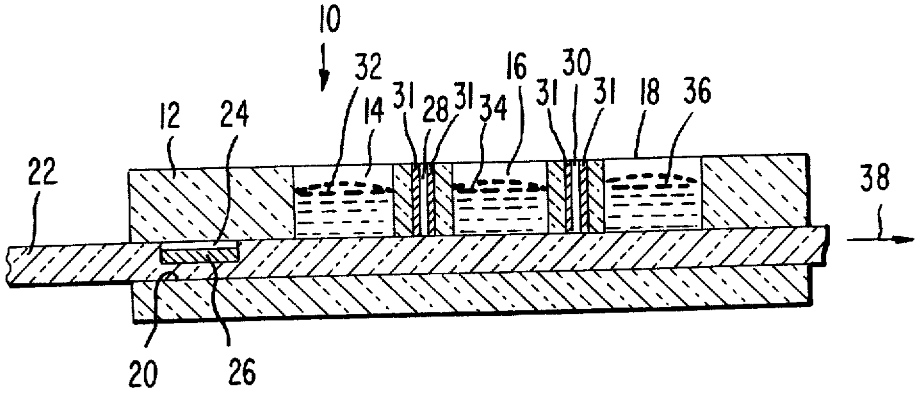
10
32
31
28
31
34
16
30
31
31
18
36
12
24
14
22
38
20
26

METHOD FOR DEPOSITING ON A SUBSTRATE A PLURALITY OF EPITAXIAL LAYERS IN SUCCESSION

BACKGROUND OF THE INVENTION

The invention herein disclosed was made in the course of or under a contract or subcontract thereunder with the Department of the Army.

The present invention relates to a method and apparatus for depositing on a substrate a plurality of epitaxial layers in succession by liquid phase epitaxy. In particular, it relates to such a method and apparatus wherein carry over of the deposition solutions from one well of a furnace boat to the next well is prevented.

A technique which has come into use for making certain types of semiconductor devices, particularly semiconductor devices made of the group III-V semiconductor materials and their alloys, such as light-emitting devices and transferred electron devices, is known as "liquid phase epitaxy." Liquid phase epitaxy is a method for depositing an epitaxial layer of a single crystalline semiconductor material on a substrate wherein a surface of the substrate is brought into contact with a solution of a semiconductive material dissolved in a molten metal solvent, the solution is cooled so that a portion of the semiconductor material in the solution precipitates and deposits on the substrate as an epitaxial layer, and the remainder of the solution is removed from the substrate. The solution may also contain a conductivity modifier which deposits with the semiconductor material to provide an epitaxial layer of a desired conductivity type. Two or more epitaxial layers can be deposited one on top of the other to form a semiconductor device of a desired construction including a semiconductor device having a PN junction between adjacent epitaxial layers of opposite conductivity type.

U.S. Pat. No. 3,565,702 to H. Nelson issued Feb. 23, 1971 entitled "Depositing Successive Epitaxial Semiconductive Layers From The Liquid Phase" describes a method and apparatus for depositing one or more epitaxial layers by liquid phase epitaxy which are particularly useful for depositing a plurality of epitaxial layers in succession. The apparatus includes a furnace boat of a refractory material having a plurality of spaced wells in its top surface and a slide of a refractory material movable in a passage which extends across the bottoms of the wells. In the use of this apparatus, a solution is provided in a well and a substrate is placed in a recess in the slide. The slide is then moved to bring the substrate into the bottom of the well so that the surface of the substrate is brought into contact with the solution. When the epitaxial layer is deposited on the substrate, the slide is moved to carry the substrate out of the well. To deposit a plurality of epitaxial layers on the substrate, separate solutions are provided in separate wells and the substrate is carried by the slide to each of the wells in succession to deposit the epitaxial layers on the substrate.

A problem which arises with the use of a deposition furnace boat of the type described in U.S. Pat. No. 3,565,702 results from the fact that when the slide is moved to carry the substrate from one well to the next, there is a tendency to carry over some of the solution from the one well to the next. This carry-over is caused by the surface tension between the solution and the material of the slide which drags some of the solution along with the slide as the slide is moved. If the solutions in adjacent wells are of different compositions to deposit epitaxial layers of different compositions, the carry-over solution from one well could contaminate the solution in the next adjacent well so as to adversely effect the composition of the epitaxial layer being deposited.

SUMMARY OF THE INVENTION

A method of depositing on a substrate a plurality of epitaxial layers in succession using a furnace boat having a plurality of spaced deposition solution-containing wells and a substrate-carrying slide extending across the bottoms of the wells. The method includes moving the slide to bring the substrate into each of the wells in succession and while the substrate is in each of the wells, the solution in the well is cooled to deposit an epitaxial layer of a material from the solution onto the substrate. When the substrate is moved from one well to the next, it passes across an opening in the furnace boat where any solution which may have been drawn along with the substrate is drawn off of the substrate into the opening to prevent contamination of the solution in the next well.

BRIEF DESCRIPTION OF THE DRAWING

The FIGURE of the drawing is a sectional view of a form of the apparatus of the present invention.

DETAILED DESCRIPTION

Referring to the drawing, a form of the apparatus of the present invention is generally designated as 10. The apparatus 10 comprises a furnace boat 12 of an inert, refractory material, such as graphite. The boat 12 has three spaced solution-containing wells 14, 16 and 18 in its upper surface. A passage 20 extends longitudinally through the boat 12 from one end to the other and extends across the bottoms of the wells 14, 16 and 18. A slide 22 of a refractory material, such as graphite, movably extends through the passage 20 and across the bottoms of the wells 14, 16 and 18. The slide 22 has a substrate-receiving recess 24 in its top surface. The substrate-receiving recess 24 is large enough to receive a flat substrate 26 with the substrate lying flat in the recess. The boat 12 has a pair of narrow openings or slots 28 and 30 extending from its upper surface to the passage 20. The slot 28 is located between the wells 14, 16 and the slot 30 is between the wells 16 and 18. The slots 28 and 30 are each of a width, the dimension in the longitudinal direction of the boat 12, small enough to form a capillary, preferably no greater than about one-eighth of an inch. The walls of the slots 28 and 30 may be coated with a layer 31 of a meterial which is more strongly wetted by the deposition solutions than the material of the furnace boat to enhance the capillary action of the slots. Such a material may be silicon dioxide or tungsten.

To carry out the method of the present invention, a charge is placed in each of the wells 14, 16 and 18. Each of the charges is a mixture of the material of the epitaxial layer to be deposited and a solvent for the material. For example, to deposit an epitaxial layer of gallium arsenide, the material would be gallium arsenide and the solvent would be a metal, such as gallium. To deposit an epitaxial layer of gallium aluminum arsenide, the material would be gallium arsenide and aluminum and the solvent would be a metal, such as gallium.

if the epitaxial layer to be deposited is a semiconductor material of a desired conductivity type, the charge would also include a suitable conductivity modifier, such as either tellurium or tin for an N type layer or zinc, germanium or magnesium for a P type layer. The substrate 26 is placed in the recess 24 and the slide 22 is positioned so that the substrate 26 is adjacent to but outside of the well 14.

The loaded furnace boat 12 is then placed in a furnace tube (not shown) and a flow of high purity hydrogen is provided through the furnace tube and over the furnace boat 12. The heating means for the furnace tube is turned on to heat the contents of the furnace boat 12 to a temperature at which the materials in the charges will dissolve in the solvent. For example, if the material in the charges is gallium arsenide or gallium arsenide and aluminum, the furnace boat may be heated to a temperature of between 700° and 950°C. This temperature is maintained long enough to insure complete melting and homogenization of the ingredients of the charges. Thus, the charges become first, second and third solutions 32, 34 and 36, respectively, of the material to be deposited in a heated solvent.

The slide 22 is then moved in the direction of the arrow 38 until the substrate 26 is within the well 14. This brings the surface of the substrate 26 into contact with the first solution 32. The temperature of the furnace tube is then reduced to cool the furnace boat 12 and its contents. Cooling of the first solution 32 causes some of the material in the first solution 32 to precipitate and deposit on the surface of the substrate 26 to form a first epitaxial layer.

The slide 22 is then again moved in the direction of the arrow 38 to move the substrate 26 with the first epitaxial layer thereon from the first well 14 into the second well 16. As the slide 22 is so moved, there is a tendency for some of the first solution 32 to adhere to and be dragged along with the slide 22 because of the surface tension between the first solution 32 and the material of the slide 22 or the first epitaxial layer. However, as the substrate 26 moves from the first well 14 to the second well 16, it passes across the opening provided by the slot 28. The carry-over first solution which passes under the slot 28 is drawn up into the slot 28 by capillary action so that such carry-over first solution will not be carried beyond the slot 28 with the substrate 26. Thus, when the substrate 26 reaches the well 16, any carry-over first solution 32 will have been removed by the capillary action of the slot 28 so as to prevent any contamination of the second solution 34.

When the substrate 26 is brought into the well 16, the first epitaxial layer on the substrate 26 is brought into contact with the second solution 34. The temperature of the furnace tube is again lowered to further cool the furnace boat 12 and its contents. This causes some of the material in the second solution 34 to precipitate and deposit on the first epitaxial layer to form a second epitaxial layer.

The slide 22 is then again moved in the direction of the arrow 38 to move the substrate 26 with the two epitaxial layers thereon from the well 16 to the well 18. As the substrate 26 moves from the well 16 to the well 18, it passes under the opening provided by the slot 30 where any carry-over second solution is drawn up into the slot 30 by capillary action. Thus, when the substrate 26 reaches the well 18 any carry-over second solution has been removed to prevent any contamination of the third solution 36. When the substrate 26 is in the third well 18, the surface of the second epitaxial layer is brought into contact with the third solution 36. The temperature of the furnace boat is again reduced for further cooling of the furnace boat 12 and its contents. This causes some of the material in the third solution 36 to precipitate and deposit on the second epitaxial layer to form a third epitaxial layer.

Thus, in the method and apparatus of the present invention any deposition solution which may be carried along with the movement of the slide is drawn off by capillary action into the openings provided by the slots between the wells. This prevents contamination of the deposition solutions by such carry-over solution which may be of a different composition. Although the method and apparatus of the present invention has been described with regard to depositing three epitaxial layers in succession, it may be used to deposit any number of epitaxial layers in succession. Also, although the present invention has been described with regard to a furnace boat having a slide which extends longitudinally through the boat, the present invention can be applied to other configurations of furnace boats having a slide movable across the bottoms of spaced wells. For example, the slide may be a flat plate which is rotatable across the bottoms of wells arranged in a circular path. However, no matter what the configuration of the well arrangement, and slide, a narrow slot or opening is provided between adjacent wells and extends to the slide to draw off any carry-over solution by capillary action.

I claim:

1. In a method of depositing a plurality of epitaxial layers on a substrate in successsion in a furnace boat having a plurality of wells each of which contains a solution of the material to be deposited in a solvent and a slide extending across the bottoms of the wells and carrying the substrate wherein the slide is moved to carry the substrate into each well and beneath the solution in each well in succession and while the substrate is in each well, the solution in the well is cooled to deposit a layer of the material from the solution onto the substrate, the improvement comprising while the substrate is being carried from one well to the next well, moving the substrate across an opening in the furnace boat to draw off of the substrate into the opening any solution which may have been drawn along with the substrate from the one well and thereby prevent contamination of the solution in the next well.

2. The method in accordance with claim 1 in which the solution is drawn off of the substrate into the opening by capillary action.

* * * * *